(12) United States Patent
Shabbir et al.

(10) Patent No.: US 11,520,389 B2
(45) Date of Patent: Dec. 6, 2022

(54) SYSTEMS AND METHODS TO DETERMINE AND CONTROL TEMPERATURE THRESHOLD FOR AIR-COOLED EXPANSION CARD DEVICES

(71) Applicant: DELL PRODUCTS L.P., Round Rock, TX (US)

(72) Inventors: Hasnain Shabbir, Round Rock, TX (US); Hui Chen, Shanghai (CN)

(73) Assignee: Dell Products L.P., Round Rock, TX (US)

( * ) Notice: Subject to any disclaimer, the term of this patent is extended or adjusted under 35 U.S.C. 154(b) by 107 days.

(21) Appl. No.: 17/146,394

(22) Filed: Jan. 11, 2021

(65) Prior Publication Data

US 2022/0221920 A1   Jul. 14, 2022

(51) Int. Cl.
*G06F 1/20* (2006.01)
*H05K 7/20* (2006.01)

(52) U.S. Cl.
CPC .............. *G06F 1/206* (2013.01); *H05K 7/202* (2013.01); *H05K 7/20172* (2013.01); *H05K 7/20209* (2013.01)

(58) Field of Classification Search
CPC ........ G06F 1/206; G06F 1/203; G06F 1/1694; G06F 1/20; H05K 7/20209; H05K 7/20136; H05K 7/20836; H05K 7/20172; H05K 7/202; G05B 2219/49216; H01L 23/34; H01L 23/467
See application file for complete search history.

(56) References Cited

U.S. PATENT DOCUMENTS

| | | | | |
|---|---|---|---|---|
| 5,285,347 | A  * | 2/1994 | Fox | ............................ G06F 1/20 257/714 |
| 7,249,718 | B2 * | 7/2007 | Beitelmal | ........... H05K 7/20209 361/695 |
| 8,156,358 | B2 | 4/2012 | Brumley et al. | |
| 9,280,191 | B2 | 3/2016 | Rahardjo et al. | |
| 9,494,954 | B2 | 11/2016 | Artman et al. | |
| 9,785,208 | B2 * | 10/2017 | Lovicott | .................. G06F 1/206 |

(Continued)

OTHER PUBLICATIONS

Wikipedia, "PCI Express", obtain from Internet Jan. 7, 2021, 36 pgs.

(Continued)

*Primary Examiner* — Michael A Matey
(74) *Attorney, Agent, or Firm* — Egan, Enders & Huston LLP.

(57) ABSTRACT

Disclosed herein are systems and methods of determining a maximum allowable air temperature limit for closed loop (CL) control of the inlet boundary or threshold temperature of a given computer expansion slot that contains a particular mating expansion card. The maximum allowable air temperature limit may be determined for closed loop control of the expansion slot inlet boundary temperature by using reverse correlation of an open loop (OL) cooling tier curve that has been designated for open loop control of cooling air velocity provided to the particular expansion card of the given expansion slot. The reverse correlation may be performed in further view of the particular expansion slot airflow characteristics (e.g., maximum expansion slot airflow velocity capacity or limit) corresponding to a expansion card received in a given expansion slot.

20 Claims, 6 Drawing Sheets

(56) References Cited

U.S. PATENT DOCUMENTS

| | | | |
|---|---|---|---|
| 9,901,007 B1* | 2/2018 | Reynov | H05K 7/20309 |
| 10,353,446 B2 | 7/2019 | Lovicott et al. | |
| 10,372,575 B1 | 8/2019 | North et al. | |
| 10,481,655 B2 | 11/2019 | Ragupathi et al. | |
| 10,499,540 B2* | 12/2019 | North | G06F 1/324 |
| 10,788,847 B2 | 9/2020 | North et al. | |
| 2006/0032250 A1* | 2/2006 | Flanigan | G05D 23/1905 |
| | | | 62/157 |
| 2007/0002536 A1* | 1/2007 | Hall | H05K 7/20754 |
| | | | 361/695 |
| 2012/0224322 A1* | 9/2012 | Artman | H05K 7/20209 |
| | | | 361/679.48 |
| 2013/0176680 A1* | 7/2013 | Lovicott | G05B 15/02 |
| | | | 361/679.48 |
| 2013/0226364 A1* | 8/2013 | Artman | G06F 1/206 |
| | | | 700/300 |
| 2014/0032011 A1 | 1/2014 | Artman et al. | |
| 2016/0183406 A1* | 6/2016 | Ragupathi | H05K 7/20836 |
| | | | 700/282 |
| 2017/0017281 A1 | 1/2017 | Artman et al. | |

OTHER PUBLICATIONS

Dell, White Paper, "PCIe Card Cooling With Dell EMC PowerEdge Servers", Dec. 2019, 13 pgs.

\* cited by examiner

SYSTEMS AND METHODS TO DETERMINE AND CONTROL TEMPERATURE THRESHOLD FOR AIR-COOLED EXPANSION CARD DEVICES

FIELD

This invention relates generally to information handling systems and, more particularly, to cooling expansion cards of information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

One or more cooling fans are typically employed within the electronic chassis enclosure of information handling system platforms, such as servers, to cool components operating within the information handling system chassis. Examples of such components include Peripheral Component Interconnect Express (PCIe) cards that are plugged into mating PCIe slots within the chassis enclosure of the information handling system. The type of method used by an information handling system to set cooling fan speed for cooling a given PCIe card depends on whether or not the given PCIe card has an onboard (or integrated) temperature sensor that measures the operating temperature of the PCIe card in real time. Closed loop (CL) temperature control is used by an information handling system to control the cooling fan speed for a given PCIe card if the given PCIe card has an integrated onboard temperature sensor, and if the temperature of the PCIe card is read from the temperature sensor in real time. However, open loop (OL) temperature control is used to set the cooling fan speed for a given PCIe card that has no onboard temperature sensor, or in a backup control mode for a PCIe card that has an onboard temperature sensor that is not read or supported by the information handling system.

Using open loop temperature control, cooling fan speed is set to cool a PCIe card whose temperature is not monitored in real time. PCIe adapter vendors or manufacturers develop PCIe cards having a default maximum allowable card inlet boundary temperature limit of 55° C., and define the cooling air velocity requirement for the PCIe card in terms of linear feet per minute (LFM) for open loop temperature control. A PCIe adapter vendor may also designate a particular open loop (OL) cooling tier curve for a given PCIe card, which may be selected from a group of predefined OL cooling tier curves for open loop temperature control. Each OL cooling tier curve specifies cooling airflow velocity requirement for the given PCIe card as a function of inlet air temperature to the PCIe slot in which the given PCIe card is installed. A thermal control algorithm may execute on the server baseboard management controller (BMC) of a server to read this designated OL cooling tier curve for the given PCIe card either from non-volatile memory on the field replaceable unit (FRU) of the PCIe card itself, or from a white list stored in non-volatile memory coupled to the BMC.

The open loop thermal control algorithm executing on the BMC may then use the designated OL cooling tier curve to determine the required cooling fan airflow velocity as a function of sensed inlet air temperature to the PCIe slot in which the given PCIe card is installed, and to work with other system components to provide the required cooling fan airflow velocity specified by the OL cooling tier curve for the real time sensed inlet air temperature to the PCIe slot containing the given PCIe card. However, when this type of open loop temperature control is used to control cooling of a given PCIe card, there is no corresponding warning limits available to display or control to, other than setting the cooling fan speed to meet the cooling fan airflow velocity specified by the OL cooling tier curve for the measured PCIe slot inlet temperature.

SUMMARY OF THE INVENTION

Disclosed herein are systems and methods of determining a maximum allowable air temperature limit for closed loop (CL) control of the inlet boundary or threshold temperature of a given computer expansion slot, such as a Peripheral Component Interconnect Express (PCIe) slot. The maximum allowable air temperature limit may be determined for closed loop control by using reverse correlation of an open loop (OL) cooling tier correlation (e.g., curve) that has been designated for open loop control of cooling air velocity provided to a particular mating expansion card (e.g., PCIe card) and its heat-producing component/s received within the given expansion slot of an information handling system. The reverse correlation may be performed in further view of the particular expansion slot airflow characteristics (e.g., maximum expansion slot airflow velocity capacity or limit) corresponding to an expansion card received in a given expansion slot.

The determined maximum allowable inlet air temperature may then be further employed for closed loop control and limiting of the real time temperature of the cooling air provided to the inlet boundary of the given expansion slot containing the particular expansion card by varying the cooling air velocity, and/or by implementing power capping to control heat imparted to the cooling air by other heat producing components that are upstream in the cooling air flow to the given expansion slot. In this way, closed loop control of the temperature sensed at the inlet boundary of the given expansion slot (and not the sensed temperature of the expansion card device itself) may be used to maintain the expansion slot inlet boundary temperature at or below the maximum allowable inlet air temperature determined from the reverse correlation of the open loop cooling tier curve for the particular expansion card received within the given expansion slot. This achieves closed loop control of the inlet boundary temperature for an expansion card that would otherwise only be open loop-controlled using conventional techniques. Implementing closed loop control of the inlet boundary temperature of a given expansion card enables warning and critical limits to be set for the inlet boundary temperature of the expansion card.

In one respect, disclosed herein is an information handling system, including: a chassis enclosure; at least one expansion slot contained within the chassis enclosure, the at least one expansion slot being configured to receive a mating expansion card including a heat-producing component; at least one temperature sensor configured to sense and provide a temperature signal representing the real time sensed temperature at an inlet of the at least one expansion slot; at least one cooling fan configured to operate at multiple speeds to provide different flow rates of cooling air within the chassis enclosure to the inlet of the at least one expansion slot, the inlet of the at least one expansion slot having a predetermined maximum inlet airflow velocity that is deliverable to the inlet of the at least one expansion slot by the at least one cooling fan when the at least one cooling fan is running at its maximum speed; and at least one programmable integrated circuit that is coupled to receive the temperature signal from the at least one temperature sensor. The programmable integrated circuit may be programmed to: access the predetermined maximum inlet airflow velocity for the at least one expansion slot; select a predefined relationship between local approach cooling air temperature and required cooling airflow approach velocity at the inlet of the at least one expansion slot for the at least one mating expansion card including the heat-producing component; determine a maximum slot inlet temperature limit for the mating expansion card to be equal to a given local approach cooling air temperature of the predefined relationship between local approach cooling air temperature and required cooling airflow approach velocity that corresponds to the predetermined value of maximum inlet airflow velocity; and use the determined maximum slot inlet temperature limit as a temperature setpoint for closed loop control of the inlet temperature of the at least one expansion slot based on real time feedback of the temperature signal representing the real time sensed temperature at an inlet of the at least one expansion slot that is received from the at least one temperature sensor by controlling at least one of a real time speed of the at least one cooling fan or by power capping a real time power-consumption of at least one other heat-producing component within the chassis enclosure that is different from the heat-producing component of the mating Expansion card.

In another respect, disclosed herein is a method, including: receiving a temperature signal from at least one temperature sensor, the temperature signal representing a real time sensed temperature at an inlet of at least one expansion slot within a chassis enclosure of an information handling system; operating at least one heat-producing component of a mating expansion card received within the at least one expansion slot; accessing a predetermined value of maximum inlet airflow velocity that is deliverable to the inlet of the at least one expansion slot by at least one variable speed cooling fan within the chassis enclosure when the variable speed cooling fan is operating within the chassis enclosure at its maximum speed; selecting a predefined relationship between local approach cooling air temperature and required cooling airflow approach velocity at the inlet of the at least one expansion slot for mating expansion card including the at least one heat-producing component; determining a maximum slot inlet temperature limit for the mating expansion card to be equal to a given local approach cooling air temperature of the predefined relationship between local approach cooling air temperature and required cooling airflow approach velocity that corresponds to the predetermined value of maximum inlet airflow velocity; and using the determined maximum slot inlet temperature limit as a temperature setpoint for closed loop control of the inlet temperature of the at least one expansion slot based on real time feedback of the temperature signal representing the real time sensed temperature at the inlet of the at least one expansion slot that is received from the at least one temperature sensor by controlling at least one of a real time speed of the at least one cooling fan within the chassis enclosure or by power capping a real time power-consumption of at least one other heat-producing component within the chassis enclosure that is different from the heat-producing component of the mating expansion card.

DESCRIPTION OF ILLUSTRATIVE EMBODIMENTS

Figure 1:
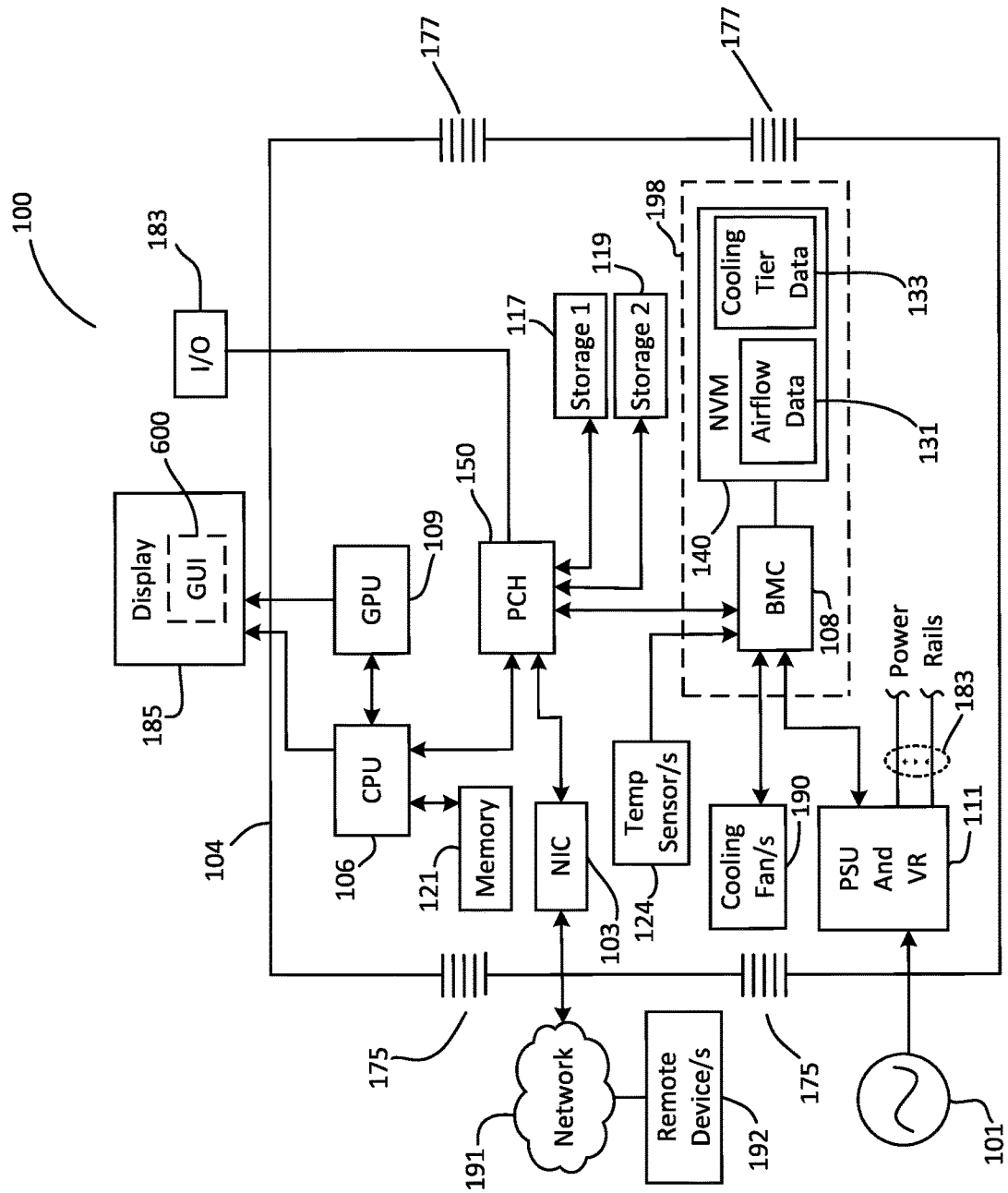
FIG. 1 illustrates a block diagram of an information handling system platform according to one exemplary embodiment of the disclosed systems and methods.

FIG. 1 illustrates one exemplary embodiment of an information handling system platform 100 configured in this embodiment as a server platform, although the disclosed systems and methods may be implemented with other types of information handling system configurations such as desktop or tower computer configurations, workstation configurations, notebook computer configurations, etc. As shown, system platform 100 includes individual and discrete heat-producing electrical components (e.g., components 103, 106, 108, 109, 111, 121, 140, 150, etc.) and one or more variable speed cooling fans 190 that are configured to cool the respective heat-producing components based on sensed and reported temperature information provided from temperature sensor/s 124 as described further herein. In the illustrated embodiment of FIG. 1, each of the cooling fan/s 190, temperature sensor/s 124 and individual heat-producing components are contained within a chassis enclosure 104 (e.g., plastic enclosure, sheet metal enclosure, etc.) that encloses internal components of the information handling system 100 therein. Examples of chassis enclosures 104 include, but are not limited to, 2U, 3U, 4U computer chassis, tower or desktop computer chassis, etc.). As shown, cooling fan/s 190 are provided to cool the heat-producing components by circulating cooling air through the interior of chassis enclosure 104 from cooling air inlets 175 to cooling air outlets 177 that are defined through the walls of chassis enclosure 104.

Examples of heat-producing components illustrated in the embodiment of FIG. 1 include a host programmable integrated circuit 106, video/graphics hardware (e.g., discrete graphics processing unit or video card/s) 109, volatile memory (e.g., DRAM dual in-line memory module/s) 121, system power supply and voltage regulator/s 111, first storage device 117, optional second storage device 119, persistent or non-volatile (e.g., non-volatile RAM) memory 140, an out-of-band programmable integrated circuit 108 in the form of a baseboard management controller "BMC" (e.g., with other possible examples being a service processor, embedded processor, etc.), and a network interface controller (NIC) 103. Together, BMC 108 and non-volatile memory 140 may be configured as a remote access controller 198, e.g., such as an integrated Dell Remote Access Controller (iDRAC) available from Dell Technologies of Round Rock, Tex., etc.), in which case non-volatile memory 140 may store, among other things, remote access controller component firmware.

Still referring to FIG. 1, power supply and voltage regulator/s (PSU and VR) 111 supplies power to all power-consuming components of system 100 via power rails 183, including cooling fan/s 190 and heat-producing electrical components of system 100. It will be understood that other types and combinations of heat-producing components are possible, e.g., a given system 100 may be provided with two or more PSU's 111 for supplying all the power-consuming components of system 100 and/or two or more host programmable integrated circuits 106. In one embodiment, out-of-band programmable integrated circuit 108 may be coupled and configured to monitor and/or control (and thus be aware of) total power provided by the one or more PSUs 111 to power all the power-consuming components of system 100, and may also be coupled and configured to monitor and/or control (and thus be aware of) real time power consumption by individual power-consuming components (e.g., such as individual cooling fans 190). In this regard, programmable integrated circuit 108 may be configured to directly monitor power consumption of an individual power-consuming component and/or may be configured to receive reported component power consumption from another intervening component (e.g., chassis power manager) of system 100, e.g., such as described in U.S. Pat. No. 8,156,358 which is incorporated herein by reference in its entirety for all purposes.

Referring now in more detail to the embodiment of FIG. 1, host programmable integrated circuit 106 is configured in this embodiment as a central processing unit (CPU) that executes an operating system (OS) for system 100. CPU 106 may include, for example, an Intel Xeon series processor, an Advanced Micro Devices (AMD) processor or another type of programmable integrated circuit. In FIG. 1, optional GPU 109 is coupled in signal communication with CPU 106 (e.g., by conductor including PCI-Express lanes, power supply bus, power, thermal and system management signals, etc.) to transfer instructions and data for generating video images from CPU 106 to the GPU 109. Optional GPU 109 may be an NVidia GeForce series processor, an AMD Radeon series processor, or another type of programmable integrated circuit that is configured to perform graphics processing tasks and provide a rendered video image (e.g., as frame buffer data) by output digital video signals (e.g., HDMI, DVI, SVGA, VGA, etc.) to display device 185 (e.g., LED display, LCD display, or other suitable type of display device) of system 100. It will be understood that in other embodiments CPU 106 may alternatively provide video images directly to display 185, including in those cases where optional GPU 109 is not present. Still referring to the exemplary embodiment of FIG. 1, CPU 106 is shown coupled to system memory 130 via a data channel. System memory 130 may include, for example, random access memory (RAM), read only memory (ROM), dynamic RAM (DRAM), synchronous DRAM (SDRAM), and/or other suitable storage mediums. CPU 106 is also coupled to platform controller hub (PCH) 150, which facilitates input/output functions for information handling system 100. Local system storage 117 and 119 (e.g., one or more media drives such as solid state drives, hard disk drives, optical drives, etc.) are each coupled to PCH 150 to provide non-volatile storage for the information handling system 100. Optional input/output devices 183 (e.g., a keyboard, mouse, touchscreen, etc.) may be coupled to PCH 150 as shown to enable a local system user to interact with components of information handling system 100 including application programs or other software/firmware executing thereon. Also shown coupled to PCH 150 is network interface controller (NIC) 103 that may be present to allow CPU 106 and/or BMC 108 to wired and/or wirelessly communicate with other remote information handling system devices 192 (e.g., such as client information handling systems, etc.) across network 191 which may be the Internet, corporate intranet or other suitable network communication medium In the embodiment of FIG. 1, out-of-band programmable integrated circuit 108 is provided in the form of a baseboard management controller "BMC" (e.g., with other possible examples being a service processor, embedded processor, etc.). As shown, BMC 108 is coupled to non-volatile memory or persistent storage 140. BMC 108 is also coupled to PCH 150 by a data bus and is configured to perform out-of-band and system tasks including, but not limited to, providing control signals to control cooling fan speed and to control operation of power supply/voltage regulation circuitry 111 that itself receives external power (e.g., such as alternating current from AC mains 101 as shown) and in turn provides suitable regulated and/or converted direct current power via power rails 183 for operating the system power-consuming components. As used herein, an out-of-band programmable integrated circuit is separate and independent from any in-band host central processing unit (CPU) that runs the host OS of the information handling system, and without management of any application executing with a host OS on the host CPU.

Figure 2:
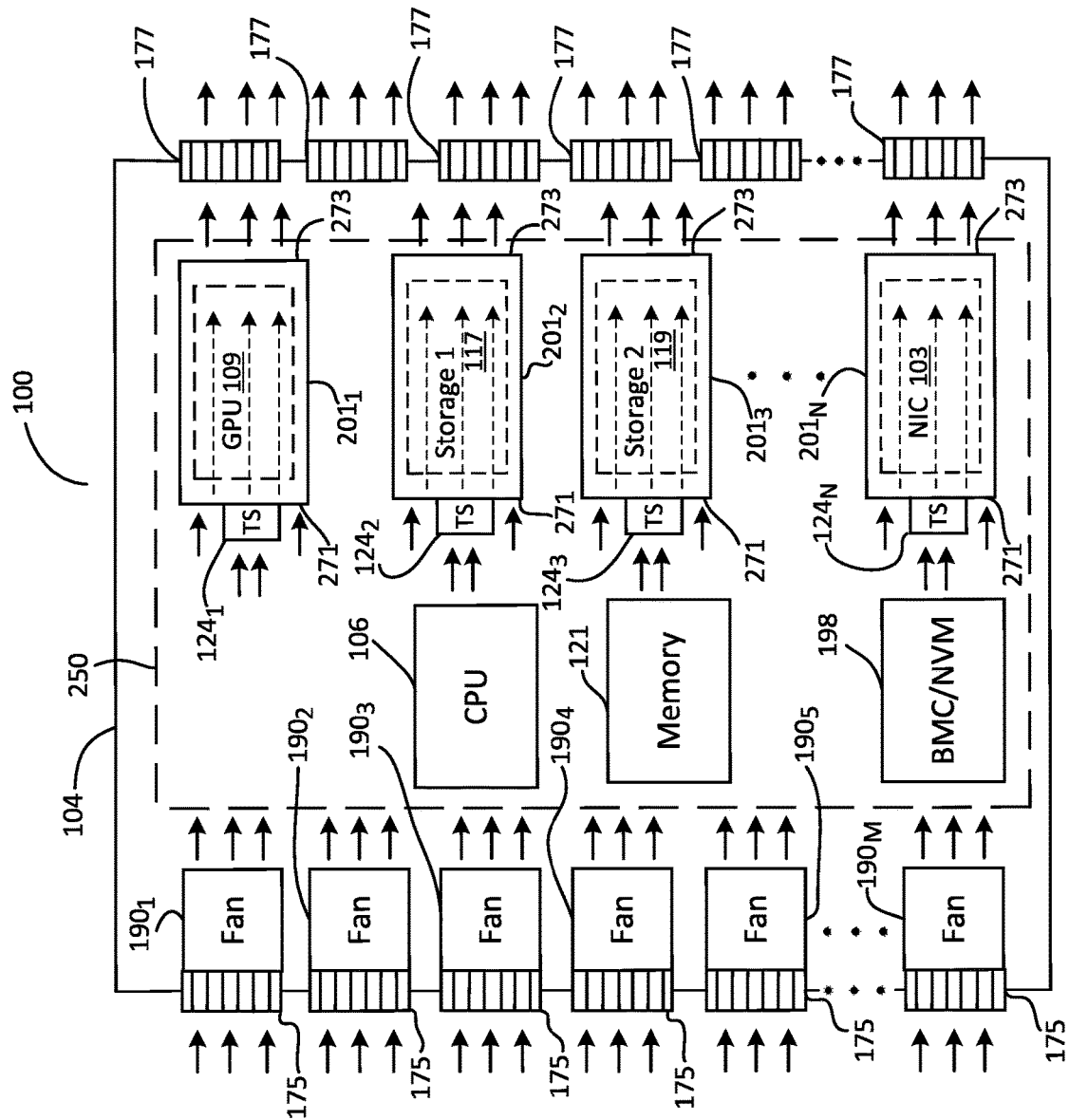
FIG. 2 illustrates an overhead block diagram view of an exemplary embodiment of an information handling system chassis enclosure according to one exemplary embodiment of the disclosed systems and methods.

FIG. 2 illustrates an overhead view of an exemplary embodiment of a chassis enclosure 104 of an information handling system 100 with its top wall removed. In FIG. 2, information handling system 100 is configured with multiple heat-producing components within chassis enclosure 104. Information handling system 100 also includes multiple computer expansion slots $201_1$ to $201_N$ that may be provided on system motherboard 250 within chassis enclosure 104, in this case with a respective open loop cooling expansion card 103, 109, 117 or 119 (including a heat-producing component) inserted into each expansion slot $201_1$ to $201_N$.

For purposes of illustration and example only, the expansion slots 201 and mating expansion cards of FIGS. 2-6 will be described below as being Peripheral Component Interconnect Express (PCIe) slots and mating PCIe cards. However, it will be understood that in other embodiments, other types and configurations of expansion slots 201 and mating expansion cards (e.g., corresponding to different types of computer expansion bus configurations) may be similarly employed (or substituted) in place of PCIe slots and PCIe cards in the following embodiments of FIGS. 2-6. In such other embodiments, a given type expansion slot 201 may be coupled to a corresponding type of computer expansion bus for exchanging signals such as data, power, etc.

Computer expansion card slots 201 and computer expansion cards configured for mating with expansion slots 201 may include, for example, high-speed serial computer expansion bus slots such as Peripheral Component Interconnect Express (PCIe) slots and mating PCIe cards configured according to PCIe 1.0, 2.0, 3.0 4.0, 5.0, etc. standards available from the Peripheral Component Interconnect Special Interest Group (PCI-SIG). In one PCIe embodiment, possible form factors for PCIe slots 201 include, but are not limited to, x1, x2, x4, x8 and x16 sized PCIe slots, in which the "x" prefix identifies the lane count (or number of differential signaling pairs) present in a particular PCIe slot 201, e.g., "x16" represents a 16-lane card or slot. In this regard, a given PCIe card will fit into a PCIe slot 201 that has its same physical size (i.e., its same lane count) or a larger size. In other embodiments, a PCIe slot 201 may be configured with other form factors that utilize a PCIe high speed serial computer expansion bus standard, e.g., such as PCI Express Mini Card form factor.

Other heat-producing components present within chassis enclosure 104 of FIG. 2 include CPU package 106 (received in corresponding CPU socket on motherboard 250), memory 121 (e.g., one or more dual in-line memory modules "DIMMs" received within corresponding DIMM slots on motherboard 250), and a remote access controller 198 (e.g., including BMC 108 and its NVM 140) that may be integrated on the motherboard 250. Not shown is PSU and VR 111 which may be present within chassis enclosure 104 and cooled with one or more dedicated cooling fan/s integrated with the PSU/VR 111. It will be understood that number and identity of heat-producing components illustrated in the embodiment of FIG. 2 are exemplary only, and that the number and location of PCIe slots 201 and/or the identity of heat-producing components inserted within each PCIe slot 201 may vary in other embodiments. For example, in an alternate embodiment, a PSU may be located external to the chassis enclosure 104 and coupled to a VR and power rails that are integrated within chassis enclosure 104.

In the embodiment of FIG. 2, chassis enclosure 104 may be, for example, a rack mount 1U or 2U server chassis, although a chassis enclosure 104 may be configured in other sizes and shapes, e.g., including larger server chassis (e.g., 3U, 4U, 5U, 6U, 7U, etc.), desktop or tower chassis enclosure, etc. As shown in FIG. 2, multiple cooling fans $190_1$ to $190_M$ (e.g., provided as a gang of cooling fans $190_1$ to $190_M$) may be present to draw in cooling air though air inlets 175 from outside chassis enclosure 104 and pass the cooling air past and in contact with the heat-producing components within chassis enclosure 104, then to be expelled out of chassis enclosure 104 through air outlets 177 in the direction of the arrows as shown. In one embodiment, each of the given PCIe slots $201_1$ to $201_N$ may be an enclosed slot, e.g., with solid slot enclosure walls and open ends or otherwise defining an enclosed airflow path due to adjacent structures, adjacent-mounted PCIe cards, etc. In FIG. 2, each of PCIe slots $201_1$ to $201_N$ has an open inlet end 271 and an open outlet end 273 that allow cooling air to pass through the enclosed airflow path (e.g., between the slot enclosure walls) of the respective slot 201 over an inserted open loop PCIe card 103, 109, 117 or 119 (which are each shown in dashed hidden line outline in FIG. 2). The enclosed airflow path through each of PCIe slots $201_1$ to $201_N$ is illustrated by the dashed arrows in FIG. 2.

Still referring to FIG. 2, exemplary inlet vents 175 and outlet vents 177 are shown defined in the enclosure wall of chassis enclosure 104. Inlet vents 175 are provided to allow fan/s 190 to draw ambient cooling air into chassis enclosure 104 from the atmosphere surrounding outside chassis enclosure 104 so that it may be circulated by fan/s 190 across the heat-producing components within the enclosure 104. Outlet vents 177 are provided to allow this air that has been heated by transfer of heat from the heat-producing components fan/s 190 to be exhausted back to the outside atmosphere around chassis enclosure 104. It will be understood that the illustrated number and configuration of vents 175 and 177 (and their relationship to fan/s 190 and fan zones 105) is exemplary only, and that any other number and/or configuration of inlet and outlet vents 175 and 177 is possible that is suitable for allowing circulation of cooling air across the heat-producing component/s of each cooling fan zone 105, and that each fan 190 does not need to have an exclusive designated vent 175 or 177.

As previously described, heat-producing components may be open loop PCIe cards (e.g., 103, 109, 117 or 119) without integrated temperature sensors, and that are operably plugged or inserted into corresponding mating PCIe slots $201_1$ to $201_N$ within the chassis enclosure 104 of information handling system 100. As further shown in FIG. 2, a respective temperature sensor 124 may be present to sense and report real time current temperature at the inlet boundary of each of PCIe slots $201_1$ to $201_N$ (e.g., as an analog or digital temperature signal that includes real time sensed temperature data). In one embodiment, each of NIC 103, GPU 109, first storage 117 and optional second storage 119 may be a PCIe device that does not have an integrated (onboard) temperature sensor for sensing onboard device temperature of the PCIe card. As shown, each of NIC 103, GPU 109, first storage 117 and optional second storage 119 may be plugged or inserted into a corresponding respective PCIe slot $201_1$, $201_2$ $201_3$, or $201_4$ with a corresponding respective temperature sensor $124_1$, $124_2$, $124_3$, or $124_N$ positioned at (or adjacent) the boundary of the inlet 271 of each these respective PCIe slots $201_1$, $201_2$, $201_3$ and $201_N$ as shown in FIG. 2. Each of temperature sensors 124 is thus integrated with the chassis enclosure 104, and is not integrated with or otherwise attached to a PCIe card. One or more data buses or other suitable communication media path may also be provided (e.g., as shown in FIG. 1) for allowing communication of data (e.g., sensed temperature data, component operational power draw data, fan speed data, digital fan speed control signals) between the various components of information handling system 100.

Further examples of types and configurations of heat-producing components, temperature sensor, and cooling fan configurations may be found, for example, in United States Patent Application Publication Number 2014/0032011; United States Patent Application Publication Number 2013/0176680; United States Patent Application Publication Number 2012/0224322; and in U.S. Pat. No. 9,785,208; each of which is incorporated herein by reference in its entirety for all purposes.

Figure 3:
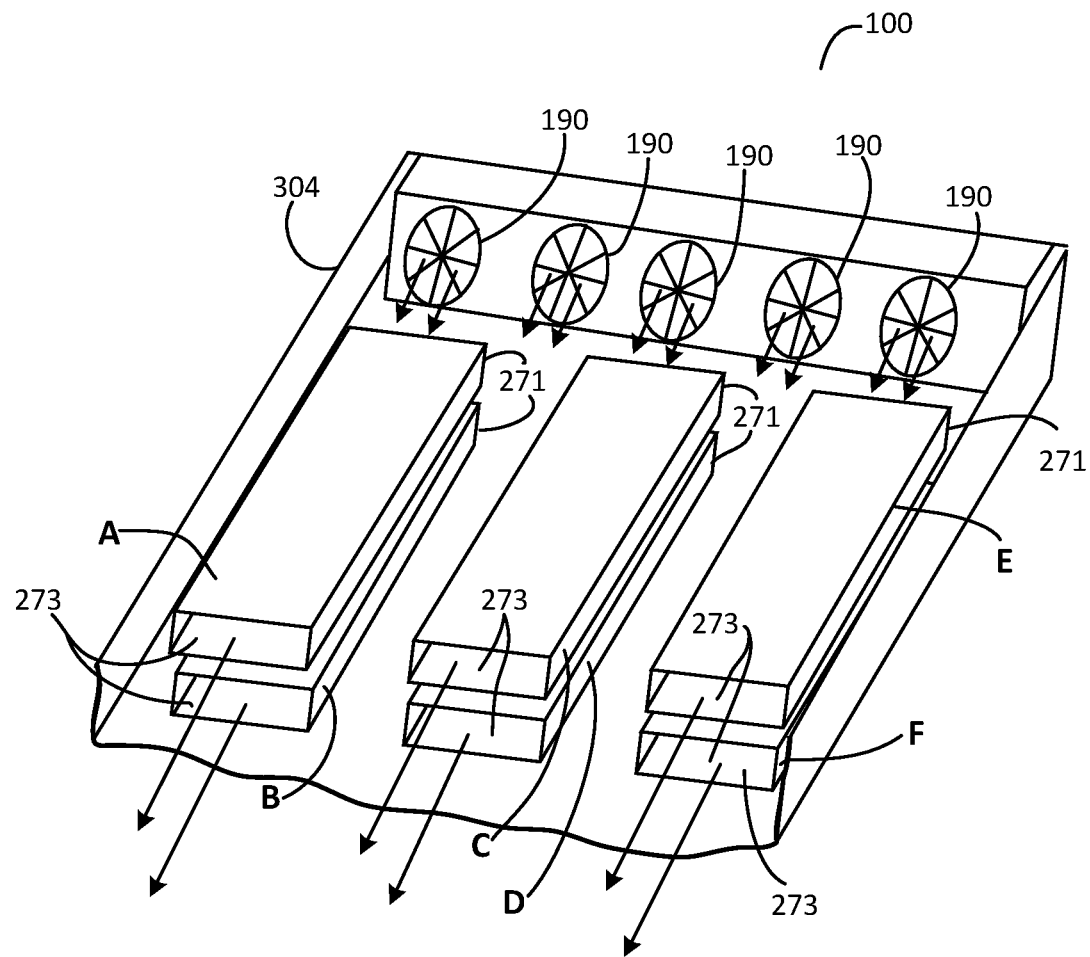
FIG. 3 illustrates a frontal perspective view of an exemplary embodiment of an information handling system chassis enclosure according to one exemplary embodiment of the disclosed systems and methods.

It will be understood that the particular configuration of PCIe slots $201_1$ to $201_N$ and type or identity of PCIe cards 103, 109, 117 or 119 shown in FIG. 2 is exemplary only. Moreover, in some embodiments, multiple PCIe cards 201 may be mounted in multiple respective PCIe slots 201 that are stacked in side-by-side parallel relationship to each other as in the cutaway view of another exemplary embodiment of a chassis enclosure 304 shown in FIG. 3. In FIG. 3, the top cover of another embodiment of a chassis enclosure 304 has been removed to show two rows of stacked PCIe slots 201 (labelled "A", "B", "C", "D", "E" and "F") that each have a respective different PCIe card received therein. Each of PCIe slots 201 has a respective maximum airflow velocity at its slot inlet 271.

In any case, due to factors such as different PCIe slot geometry and different position of each given PCIe slot relative to cooling fans 190, as well as maximum airflow velocity that is delivered by cooling fans 190 running at their maximum speed, each of the multiple PCIe slots has a maximum possible airflow velocity limit at its inlet 271 that corresponds to cooling fans 190 when running at their maximum speed. As a hypothetical example only, maximum airflow inlet velocity values for each of the PCIe slots 201 of FIG. 2 are provided in Table 1 below, it being understood that these are exemplary values provided for purposes of illustration only. These values may be the maximum airflow velocity delivered determined in the laboratory at maximum cooling fan speed by measurement and characterization for a given configuration of a chassis enclosure 104 or 304, and may be stored in NVM 140 (e.g., as a lookup table) as airflow data 131 for retrieval and use by the out-of-band programmable integrated circuit (e.g., BMC) 108. It is alternatively possible that a correlation of individual slot inlet airflow versus varying cooling fan speed may be stored as airflow data 131, from which BMC 108 may determine a maximum inlet airflow value for a given slot 201 at the maximum cooling fan speed value.

TABLE 1

| Slot | Maximum Inlet Airflow Velocity (LFM) |
| --- | --- |
| $201_1$ | 520 |
| $201_2$ | 500 |
| $201_3$ | 490 |
| ... | ... |
| $201_N$ | 690 |

Figure 4:
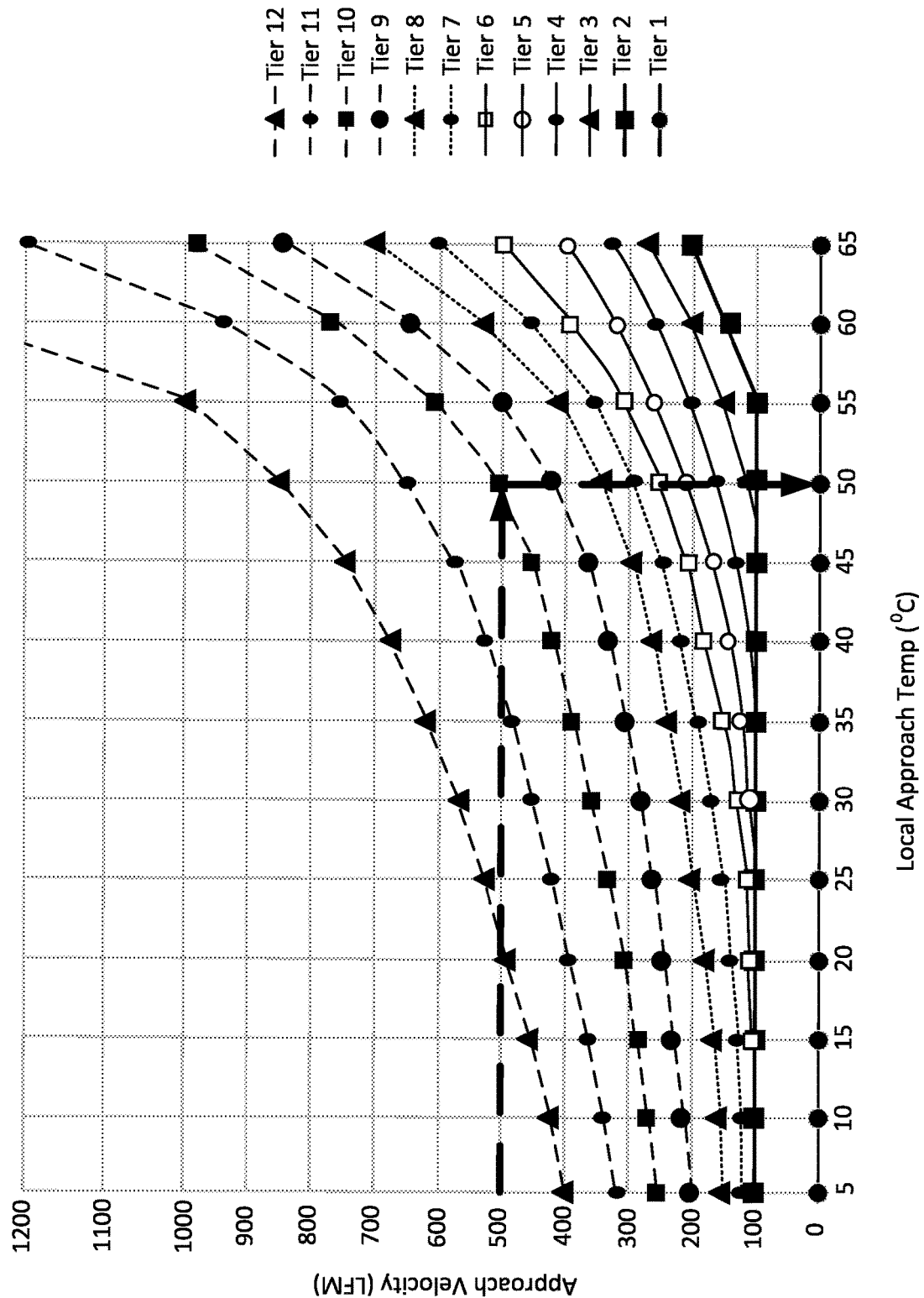
FIG. 4 illustrates multiple different cooling tier relationships according to one exemplary embodiment of the disclosed systems and methods.

FIG. 4 illustrates multiple different relationships as they may be defined (i.e., as curves 1 to 12 in this embodiment) between values of local approach cooling air temperature (measured at the boundary of PCIe slot inlet 271) and corresponding values of required cooling airflow approach velocity (required at the boundary of PCIe slot inlet 271) for open loop cooling of different respective tiers of heat-producing components mounted to a PCIe card received in a given PCIe slot 201. In one embodiment, each of the different curves of FIG. 4 may be defined for different respective cooling tiers, and then stored in NVM 140 as PCIe cooling tier data 133 for retrieval and use by the out-of-band programmable integrated circuit (e.g., BMC) 108. As so stored, each of the defined PCIe cooling tier correlations may be assigned a given cooling tier identifier, which are numbered 1 to 12 in this embodiment.

Figure 5:
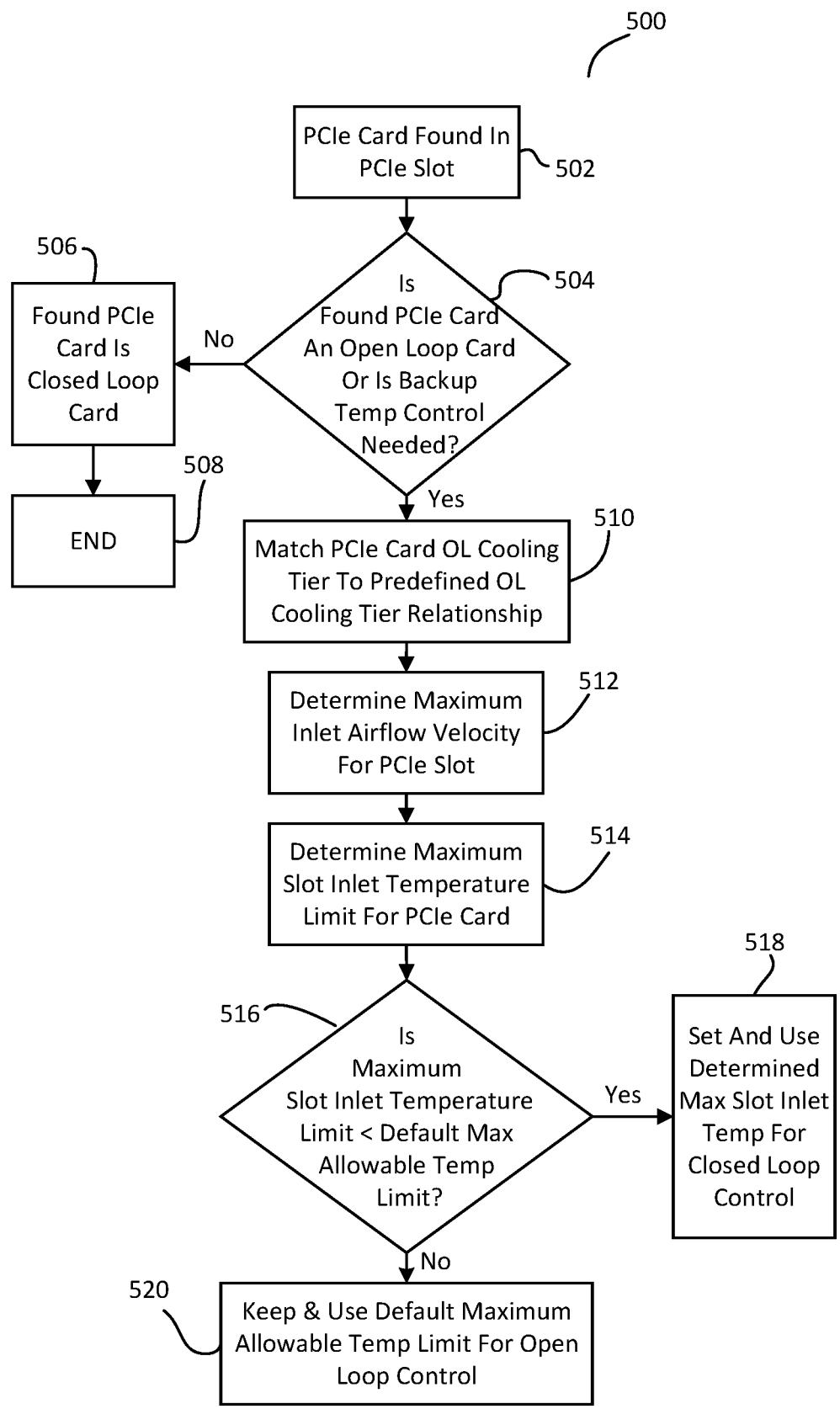
FIG. 5 illustrates methodology according to one exemplary embodiment of the disclosed systems and methods.

FIG. 5 illustrates methodology 500 that may be employed in one exemplary embodiment to determine whether or not to implement closed loop cooling control of the sensed temperature at an inlet boundary 271 of a given PCIe slot that contains a PCIe card. For purposes of illustration only, methodology 500 is described below in relation to the configuration of system 200 of FIG. 2. However, it will be understood that in other embodiments, methodology 500 may be implemented with other information handling system configurations, e.g., such as with open loop PCIe cards of system 300 of FIG. 3 or with any other system configuration of open loop PCIe cards.

Methodology 500 begins in step 502 where BMC 108 senses that a given one of PCIe cards 103, 109, 117 or 119 or other PCIe card is connected to (i.e., inserted into) a corresponding given PCIe slot 201. In step 504, BMC 108 determines if the found given PCIe card is either an open loop PCIe card having no integrated (onboard) temperature sensor, or is a PCIe card having an integrated temperature sensor but nonetheless needing a backup control solution because its integrated temperature sensor is either inoperable or otherwise cannot be read by BMC 108 (e.g., due to incompatible data format, due to improper connector mating between the PCIe card and the PCIe slot, etc.). If neither condition is determined to be the case in step 504 (i.e., the given PCIe card is determined to have a working integrated temperature sensor and BMC 108 is capable of reading the onboard temperature sensed by the integrated temperature sensor), then methodology 500 proceeds to step 506 where BMC 108 determines that the given PCIe card is a closed loop PCIe card and methodology 500 ends in step 508 as shown. BMC 108 may then execute closed loop cooling by sensing the onboard temperature of the given PCIe card and using this temperature as feedback to control the cooling fan airflow and/or power capping of heat-producing components based on the sensed onboard temperature, e.g., to maintain a particular onboard PCIe card temperature setpoint.

However, if it is determined in step 504 that the found PCIe card is either an open loop PCIe card having no integrated (onboard) temperature sensor, or is a PCIe card having an integrated temperature sensor that is either inoperable or for which its sensed temperature cannot be read by BMC 108, then methodology 500 proceeds to step 510, In step 510, BMC 108 matches a predefined cooling tier identifier (e.g., that is reported to BMC 108 by the given PCIe card and/or stored in a whitelist of a power budget table "PBT" in NVM 140) to the corresponding identifier of one of the PCIe cooling tier correlations of PCIe cooling tier data 133, and selects this matched PCIe cooling tier correlation for use in controlling cooling of the given PCIe slot 201 in which the found PCIe card is inserted. In step 512, BMC 108 determines a maximum inlet airflow velocity (e.g., in LFM) at maximum cooling fan speed for this same given PCIe slot 201, e.g., from airflow data 131 which may be a maximum slot airflow velocity lookup table or a correlation of fan speed versus airflow velocity. BMC 108 may cause display of this determined maximum inlet airflow velocity at maximum cooling fan speed for the given PCIe slot 201 to a user in a graphical user interface (GUI) on display device 185 as shown by the second column of FIG. 6.

Next, in step 514 BMC 108 may determine a maximum slot inlet temperature limit for the PCIe card that was found in the given PCIe slot 201 in step 502. In one embodiment, this maximum slot inlet temperature limit may be determined in step 514 to be equal to the local approach cooling air temperature that corresponds to the maximum inlet airflow velocity determined in step 512 (e.g., determined by reverse correlation of the matched PCIe cooling tier correlation selected in step 510). BMC 108 may cause display of this determined maximum slot inlet temperature limit for the given PCIe slot 201 to a user in a GUI on display device 185 as shown by the fourth column of FIG. 6.

Still referring to FIG. 5, methodology 500 proceeds to step 516 where the maximum slot inlet temperature limit of step 514 is compared to a non-specific default maximum allowable card inlet boundary temperature limit (e.g., 55° C.) that may be predefined by the PCIe adapter vendor or manufacturer for all its PCIe cards when received in any of PCIe slots 201. This non-specific default maximum allowable card inlet boundary temperature limit is not specifically defined only for the particular given PCIe card found in step 502, but is rather a backup maximum inlet boundary temperature value that is not to be exceeded for any of the vendor's or manufacturer's PCIe cards that are inserted into one of PCIe slots 201. If in step 516 the maximum slot inlet temperature limit of step 514 is found greater than or equal to the default maximum allowable card inlet boundary temperature limit (e.g., 55° C.), then methodology 500 proceeds to step 520 where the predefined default maximum allowable card inlet boundary temperature limit is retained and used for controlling inlet temperature of the given PCIe slot 201.

In one embodiment, the default maximum allowable card inlet boundary temperature limit may be used in step 520 for closed loop control of the inlet temperature of the given PCIe slot 201 by controlling cooling fans 190 to deliver increased cooling airflow if necessary to maintain the cooling air inlet temperature for the given PCIe slot 201 at or below the default temperature limit of 55° C. If the speed of cooling fans 190 is already at maximum (full) speed, then closed loop power-capping control may be used to control the temperature of the cooling airflow by reducing power consumption (and heat production) of other heat-producing components that are positioned upstream within the cooling air flow delivered to the given PCIe slot 201 as necessary to maintain the cooling air inlet temperature for the given PCIe slot 201 at or below the default temperature limit of 55° C. If, for example, the maximum slot inlet temperature limit of step 514 is reduced (e.g., to 52° C. in this example) due to the slot airflow limit determined as described herein, then the target inlet temperature of the given PCIe slot 201 is updated (e.g., updated to 52° C. in this example), and closed loop control of the inlet temperature of the given PCIe slot 201 is used to control cooling fans 190 to deliver increased cooling airflow if necessary to maintain the cooling air inlet temperature for the given PCIe slot 201 at or below the updated target temperature limit (e.g., 52° C. in this example).

However, if in step 516 the maximum slot inlet temperature limit of step 514 is found to be less than the default maximum allowable card inlet boundary temperature limit (e.g., 55° C.), then methodology 500 proceeds to step 518 where the determined maximum slot inlet temperature limit of step 514 is set and used in step 518 for closed loop control of the inlet boundary temperature of the given PCIe slot 201. In one embodiment, this determined maximum slot inlet temperature limit may be used as a temperature setpoint in step 518 for closed loop control of the inlet boundary temperature of the given PCIe slot 201 based on real time feedback of the sensed inlet boundary temperature of the given PCIe slot 201 from its temperature sensor 124, e.g., by controlling cooling fans 190 to deliver increased cooling airflow as necessary to maintain the cooling air inlet boundary temperature for the given PCIe slot 201 at or below the determined maximum slot inlet temperature limit, and/or by decreasing the temperature of the cooling airflow provided from the cooling fans 190 to the given PCIe slot 201 by using power capping to reduce power consumption (and heat production) of other heat-producing components that are positioned upstream within the cooling air flow delivered to the given PCIe slot 201 as necessary to maintain the cooling air inlet boundary temperature for the given PCIe slot 201 at or below the determined maximum slot inlet temperature limit. In one embodiment, the closed loop control of step 518 may be enabled with predefined warning limit temperatures and/or critical limit temperatures that are set for the inlet boundary temperature of the PCIe card, e.g., that cause display of a corresponding warning or critical limit to a user on display device 185 if the inlet boundary temperature of the PCIe card exceeds a warning limit temperature or a critical limit temperature, respectively. Further information on closed loop temperature control and/or power capping may be found, for example, in U.S. Pat. Nos. 9,280,191; 9,494,954; 9,785,208; 10,499,540; and 10,372,575, each of which is incorporated herein by reference in its entirety for all purposes.

As a hypothetical example illustration of methodology 500, BMC 108 may determine in steps 502 and 504 that PCIe card 117 (e.g., SSD storage device) is an open loop PCIe card inserted into PCIe slot $201_2$ of FIG. 2, it being understood that methodology 500 may be similarly employed to sense the presence of the other PCIe cards 103, 109, 117, or 119 that is inserted in other PCIe slots 201 of FIG. 2. PCIe card 117 may also report a cooling tier identifier number 10 to BMC 108, or BMC 108 may retrieve this information from whitelist stored on NVM 140. In step 510, BMC 108 may then match cooling tier correlation number 10 from stored cooling tier data 133 of FIG. 4 to PCIe card 117 in PCIe slot $201_2$ of FIG. 2. In step 512, BMC 108 may determine the maximum inlet airflow velocity of 500 LFM for PCIe slot $201_2$ from airflow data 131. In step 514, BMC 108 may then determine the maximum slot inlet temperature limit of 50° C. for PCIe card 117 that corresponds to the 500 LFM maximum inlet airflow velocity for PCIe slot $201_2$ by entering the graph of FIG. 4 at 500 LFM and reading the corresponding maximum local approach temperature (i.e., inlet temperature to the PCIe card 117) of 50° C. according to the open loop cooling tier correlation curve number 10 as shown by the dashed arrow in FIG. 4. This 50° C. is therefore determined by BMC 108 (using reverse correlation of the corresponding open loop cooling tier curve) to be the maximum slot inlet temperature limit at 500 LFM for PCIe card 117 within PCIe slot $201_2$.

In step 516 of this example, BMC 108 then determines that this determined maximum slot inlet temperature limit of 50° C. from step 514 is less than the default maximum card inlet boundary temperature of 55° C. BMC 108 therefore uses this determined maximum slot inlet temperature limit of 50° C. as a closed loop control parameter in step 518 to vary (e.g., increase) speed of cooling fan/s 190 to target and attempt to maintain the inlet boundary temperature of PCIe slot $201_2$ at 50° C. BMC 108 may also control power consumption of upstream heat-producing CPU 106 (and possibly memory 121) in step 518, for example, by power capping of CPU 106 and memory 121 at reduced power levels to decrease the temperature of the cooling air upstream of PCIe slot $201_2$ in order to prevent the inlet boundary temperature of PCIe slot $201_2$ from exceeding 50° C. This may be done, for example, if BMC 108 determines that the real time sensed inlet boundary temperature of PCIe slot $201_2$ will exceed 50° C. even with the rotation speed (RPM) of cooling fan/s 190 set at maximum RPM.

It will be understood that the steps of methodology 500 are exemplary only, and that any combination of fewer, additional and/or alternative steps may be employed that are suitable for determining a maximum allowable air temperature limit from an open loop (OL) cooling tier correlation that is assigned to or otherwise predefined for a particular PCIe card, and using this determined maximum allowable air temperature limit for closed loop (CL) control of the inlet boundary or threshold temperature of a given Peripheral Component Interconnect Express (PCIe) slot that contains the particular PCIe card.

Figure 6:
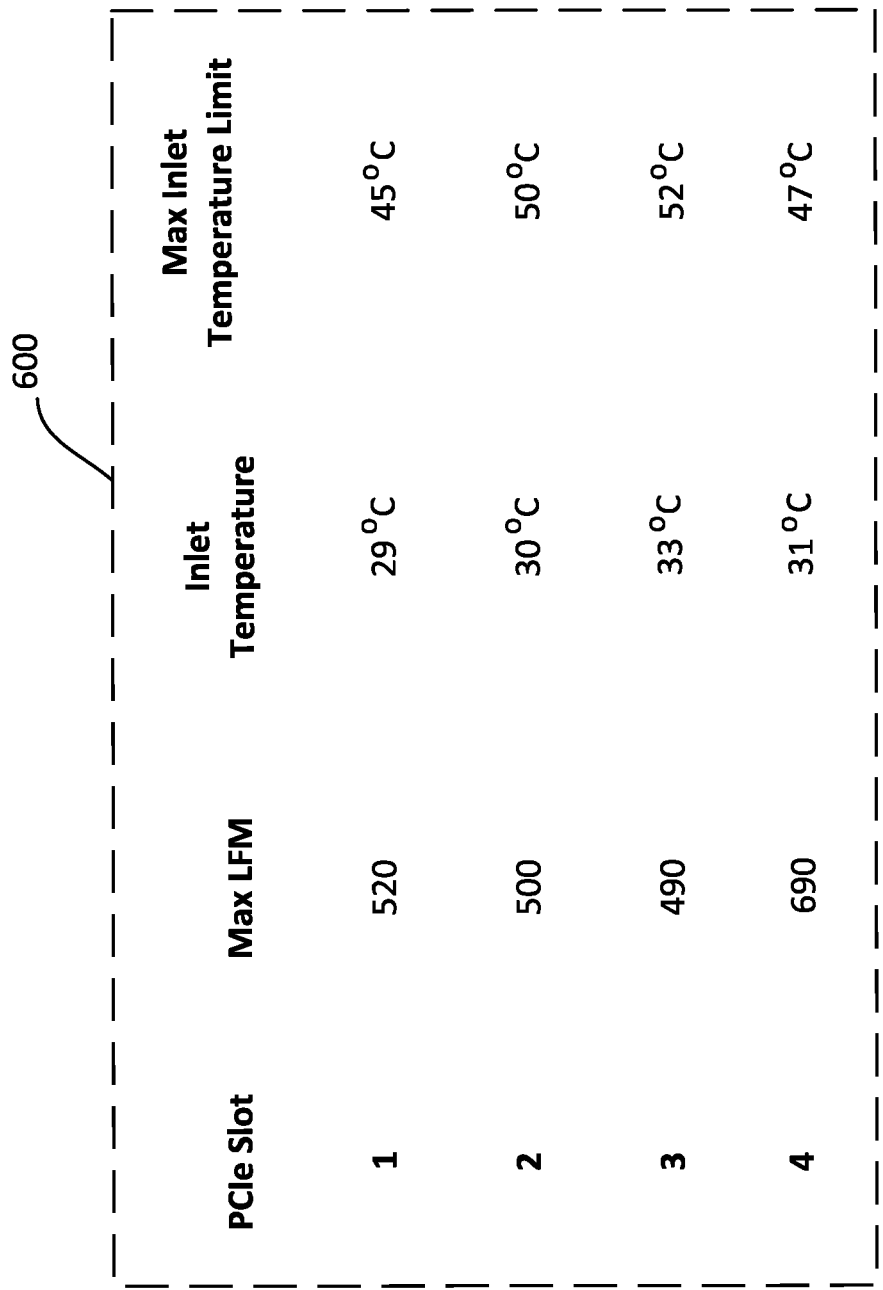
FIG. 6 illustrates a graphical user interface (GUI) according to one exemplary embodiment of the disclosed systems and methods.

FIG. 6 illustrates a GUI 600 that may be displayed in one exemplary embodiment on display device 185. As shown in FIG. 6, first column of GUI 600 indicates the PCIe slot number (e.g., slot 1=PCIe slot $201_1$, slot 2=PCIe slot $201_2$, slot 3=PCIe slot $201_3$, and slot 4=PCIe slot $201_N$ of system 100 of FIG. 2). Second column of GUI 600 indicates the maximum airflow inlet velocity values determined in step 512 for each of the PCIe slots 201 of FIG. 2, The third column of GUI 600 illustrates the current sensed real time inlet boundary temperature of each of the PCIe slots 201 of FIG. 2, and column 4 indicates the determined maximum slot inlet temperature limit set in step 518 for closed loop control of the inlet boundary temperature of each given PCIe slot 201. The parameter values given in columns two through four of GUI 600 are exemplary and hypothetical only, it being understood that actual parameter values will vary according to the circumstances of a given application. Additionally, other information (not shown) may be optionally displayed in GUI 600 for each of PCIe slots 201, e.g., such as inserted PCIe Card Classification information that may include whether or not the PCIe card within each PCIe slot 201 is a third party PCIe card, type of PCIe card within each PCIe slot 201 (e.g., GPU, memory, empty slot, etc.), and target inlet cooling airflow value or type of cooling employed for the PCIe card within each PCIe slot (e.g., fixed cooling airflow value (e.g., LFM), temperature controlled, airflow rate controlled, etc.).

It will understood that one or more of the tasks, functions, or methodologies described herein (e.g., including those described herein for components 103, 106, 108, 109, 117, 119, 121, 140, 150, etc.) may be implemented by circuitry and/or by a computer program of instructions (e.g., computer readable code such as firmware code or software code) embodied in a non-transitory tangible computer readable medium (e.g., optical disk, magnetic disk, non-volatile memory device, etc.), in which the computer program comprising instructions are configured when executed on a processing device in the form of a programmable integrated circuit (e.g., processor such as CPU, controller, microcontroller, microprocessor, ASIC, etc. or programmable logic device "PLD" such as FPGA, complex programmable logic device "CPLD", etc.) to perform one or more steps of the methodologies disclosed herein. In one embodiment, a group of such processing devices may be selected from the group consisting of CPU, controller, microcontroller, microprocessor, FPGA, CPLD and ASIC. The computer program of instructions may include an ordered listing of executable instructions for implementing logical functions in an information handling system or component thereof. The executable instructions may include a plurality of code segments operable to instruct components of an information handling system to perform the methodologies disclosed herein. It will also be understood that one or more steps of the present methodologies may be employed in one or more code segments of the computer program. For example, a code segment executed by the information handling system may include one or more steps of the disclosed methodologies. It will be understood that a processing device may be configured to execute or otherwise be programmed with software, firmware, logic, and/or other program instructions stored in one or more non-transitory tangible computer-readable mediums (e.g., data storage devices, flash memories, random update memories, read only memories, programmable memory devices, reprogrammable storage devices, hard drives, floppy disks, DVDs, CD-ROMs, and/or any other tangible data storage mediums) to perform the operations, tasks, functions, or actions described herein for the disclosed embodiments.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communications between the various hardware components.

While the invention may be adaptable to various modifications and alternative forms, specific embodiments have been shown by way of example and described herein. However, it should be understood that the invention is not intended to be limited to the particular forms disclosed. Rather, the invention is to cover all modifications, equivalents, and alternatives falling within the spirit and scope of the invention as defined by the appended claims. Moreover, the different aspects of the disclosed adapters, systems and methods may be utilized in various combinations and/or independently. Thus, the invention is not limited to only those combinations shown herein, but rather may include other combinations.

What is claimed is:

1. An information handling system, comprising:
   a chassis enclosure;
   at least one expansion slot contained within the chassis enclosure, the at least one expansion slot being configured to receive a mating expansion card comprising a heat-producing component;
   at least one temperature sensor configured to sense and provide a temperature signal representing the real time sensed temperature at an inlet of the at least one expansion slot;
   at least one cooling fan configured to operate at multiple speeds to provide different flow rates of cooling air within the chassis enclosure to the inlet of the at least one expansion slot, the inlet of the at least one expansion slot having a predetermined maximum inlet airflow velocity that is deliverable to the inlet of the at least one expansion slot by the at least one cooling fan when the at least one cooling fan is running at its maximum speed; and
   at least one programmable integrated circuit that is coupled to receive the temperature signal from the at least one temperature sensor, the at least one programmable integrated circuit being programmed to:
      access the predetermined maximum inlet airflow velocity for the at least one expansion slot;
      select a predefined relationship between local approach cooling air temperature and required cooling airflow approach velocity at the inlet of the at least one expansion slot for the at least one mating expansion card comprising the heat-producing component;

determine a maximum slot inlet temperature limit for the mating expansion card to be equal to a given local approach cooling air temperature of the predefined relationship between local approach cooling air temperature and required cooling airflow approach velocity that corresponds to the predetermined value of maximum inlet airflow velocity; and use the determined maximum slot inlet temperature limit as a temperature setpoint for closed loop control of the inlet temperature of the at least one expansion slot based on real time feedback of the temperature signal representing the real time sensed temperature at an inlet of the at least one expansion slot that is received from the at least one temperature sensor by controlling at least one of a real time speed of the at least one cooling fan or by power capping a real time power-consumption of at least one other heat-producing component within the chassis enclosure that is different from the heat-producing component of the mating expansion card.

2. The information handling system of claim 1, where the at least one temperature sensor is integrated on the expansion card, the at least one temperature sensor being inoperative or not readable by the at least one programmable integrated circuit.

3. The information handling system of claim 1, where the predefined relationship between local approach cooling air temperature and required cooling airflow approach velocity at the inlet of the at least one expansion slot is one of multiple different predefined relationships between local approach cooling air temperature and required cooling airflow approach velocity at the inlet of the at least one expansion slot for open loop cooling of different respective tiers of different types of heat-producing components; and where the at least one programmable integrated circuit is further programmed to select the predefined relationship between local approach cooling air temperature and required cooling airflow approach velocity at the inlet of the at least one expansion slot that corresponds to a designated tier for the type of heat-producing component of the mating expansion card from the multiple different predefined relationships between local approach cooling air temperature and required cooling airflow approach velocity that correspond to other of the tiers that are designated for other types of heat-producing components.

4. The information handling system of claim 3, further comprising a non-volatile memory (NVM) coupled to the at least one programmable integrated circuit; where the predetermined maximum inlet airflow velocity for the at least one expansion slot is stored on the NVM; where the multiple different predefined relationships between local approach cooling air temperature and required cooling airflow approach velocity are each stored on the NVM; and where the at least one programmable integrated circuit is programmed to access the predetermined maximum inlet airflow velocity for the at least one expansion slot from the NVM, and to select the predefined relationship between local approach cooling air temperature and required cooling airflow approach velocity corresponding to the designated tier of the heat-producing component of the mating expansion card.

5. The information handling system of claim 4, where the at least one programmable integrated circuit is programmed to determine an identity of the designated tier of the heat-producing component of the mating expansion card by retrieving data from the heat-producing component of the mating expansion card that identifies the designated tier of the heat-producing component of the mating expansion card.

6. The information handling system of claim 1, further comprising a display device coupled to the at least one programmable integrated circuit; and where the at least one programmable integrated circuit is programmed to display the determined maximum slot inlet temperature limit on the display device to a user of the information handling system.

7. The information handling system of claim 1, further comprising a display device coupled to the at least one programmable integrated circuit; and where the at least one programmable integrated circuit is programmed to compare the real time sensed temperature at the inlet of the at least one expansion slot to at least one predefined warning limit temperature or predefined critical limit temperature, and to cause display of a corresponding warning or critical limit on the display device to a user of the information handling system only if the real time sensed temperature at the inlet of the at least one expansion slot exceeds the at least one warning limit temperature or critical limit temperature.

8. The information handling system of claim 1, the at least one programmable integrated circuit is programmed to compare the determined maximum slot inlet temperature limit for the mating expansion card to a predefined default maximum allowable temperature limit that is not specific to the heat-producing component of the mating expansion card; and where the programmable integrated circuit is programmed to either:

if the determined maximum slot inlet temperature limit for the mating expansion card is less than the predefined default maximum allowable temperature limit, then use the determined maximum slot inlet temperature limit as a temperature setpoint for closed loop control of the inlet temperature of the at least one expansion slot based on real time feedback of the temperature signal representing the real time sensed temperature at the inlet of the at least one expansion slot that is received from the at least one temperature sensor by controlling at least one of a real time speed of the at least one cooling fan or by power capping a real time power-consumption of at least one other heat-producing component within the chassis enclosure that is different from the heat-producing component of the mating expansion card; or if the determined maximum slot inlet temperature limit for the mating expansion card is greater than or equal to the predefined default maximum allowable temperature limit, then use the predefined default maximum allowable temperature limit as a temperature setpoint for closed loop control of the inlet temperature of the at least one expansion slot based on real time feedback of the temperature signal representing the real time sensed temperature at an inlet of the at least one expansion slot that is received from the at least one temperature sensor by controlling at least one of a real time speed of the at least one cooling fan or by power capping a real time power-consumption of at least one other heat-producing component within the chassis enclosure that is different from the heat-producing component of the mating expansion card.

9. The information handling system of claim 1, where the at least one temperature sensor is a first temperature sensor; and where the at least one programmable integrated circuit is programmed to first determine if the mating expansion card either has no integrated second temperature sensor or has an integrated second temperature sensor that cannot be read by the at least one programmable integrated circuit; and then either:
- if the mating expansion card is determined to either have no integrated second temperature sensor or to have an integrated second temperature sensor that cannot be read by the programmable integrated circuit, then use the at least one programmable integrated circuit to receive the sensed temperature from the first temperature sensor, determine the maximum slot inlet temperature limit for the mating expansion card, and use the determined maximum slot inlet temperature limit as the temperature setpoint for closed loop control of the inlet temperature of the at least one expansion slot; or
- if the mating expansion card is determined to have an integrated second temperature sensor providing a second temperature signal that is readable by the at least one programmable integrated circuit, then receive the second temperature signal from the second temperature sensor and provide closed loop control of the temperature of the heat-producing component of the expansion card based on real time feedback of the second temperature signal representative of the real time sensed second temperature of the heat-producing component of the expansion card by controlling at least one of a real time speed of the at least one cooling fan or by power capping a real time power-consumption of at least one other heat-producing component within the chassis enclosure that is different from the heat-producing component of the mating expansion card.

10. The information handling system of claim 1, where the at least one expansion slot is a Peripheral Component Interconnect Express (PCIe) slot, and where the mating expansion card is a mating PCIe card that is configured to mate with the PCIe slot.

11. A method, comprising:
receiving a temperature signal from at least one temperature sensor, the temperature signal representing a real time sensed temperature at an inlet of at least one expansion slot within a chassis enclosure of an information handling system;
operating at least one heat-producing component of a mating expansion card received within the at least one expansion slot;
accessing a predetermined value of maximum inlet airflow velocity that is deliverable to the inlet of the at least one expansion slot by at least one variable speed cooling fan within the chassis enclosure when the variable speed cooling fan is operating within the chassis enclosure at its maximum speed;
selecting a predefined relationship between local approach cooling air temperature and required cooling airflow approach velocity at the inlet of the at least one expansion slot for the mating expansion card including the at least one heat-producing component;
determining a maximum slot inlet temperature limit for the mating expansion card to be equal to a given local approach cooling air temperature of the predefined relationship between local approach cooling air temperature and required cooling airflow approach velocity that corresponds to the predetermined value of maximum inlet airflow velocity; and
using the determined maximum slot inlet temperature limit as a temperature setpoint for closed loop control of the inlet temperature of the at least one expansion slot based on real time feedback of the temperature signal representing the real time sensed temperature at the inlet of the at least one expansion slot that is received from the at least one temperature sensor by controlling at least one of a real time speed of the at least one cooling fan within the chassis enclosure or by power capping a real time power-consumption of at least one other heat-producing component within the chassis enclosure that is different from the heat-producing component of the mating expansion card.

12. The method of claim 11, where the at least one temperature sensor is integrated within the chassis enclosure and is not integrated on the mating expansion card.

13. The method of claim 11, where the predefined relationship between local approach cooling air temperature and required cooling airflow approach velocity at the inlet of the at least one expansion slot is one of multiple different predefined relationships between local approach cooling air temperature and required cooling airflow approach velocity at the inlet of the at least one expansion slot for open loop cooling of different respective tiers of different types of heat-producing components; and where the method further comprises:
selecting the predefined relationship between local approach cooling air temperature and required cooling airflow approach velocity at the inlet of the at least one expansion slot that corresponds to a designated tier for the type of heat-producing component of the mating expansion card from the multiple different predefined relationships between local approach cooling air temperature and required cooling airflow approach velocity that correspond to other of the tiers that are designated for other types of heat-producing components.

14. The method of claim 13, where the predetermined maximum inlet airflow velocity for the at least one expansion slot is stored on a non-volatile memory (NVM); where the multiple different predefined relationships between local approach cooling air temperature and required cooling airflow approach velocity are each stored on the NVM; and where the method further comprises:
accessing the predetermined maximum inlet airflow velocity for the at least one expansion slot from the NVM; and
selecting the predefined relationship between local approach cooling air temperature and required cooling airflow approach velocity corresponding to the designated tier of the heat-producing component of the mating expansion card.

15. The method of claim 14, further comprising determining an identity of the designated tier of the heat-producing component of the mating expansion card by retrieving data from the heat-producing component of the mating expansion card that identifies the designated tier of the heat-producing component of the mating expansion card.

16. The method of claim 11, further comprising displaying the determined maximum slot inlet temperature limit on the display device to a user of the information handling system.

17. The method of claim 11, further comprising comparing the real time sensed temperature at the inlet of the at least one expansion slot to at least one predefined warning limit temperature or predefined critical limit temperature, and displaying a corresponding warning or critical limit on the display device to a user of the information handling system only if the real time sensed temperature at the inlet of the at least one expansion slot exceeds the at least one warning limit temperature or critical limit temperature.

18. The method of claim 11, further comprising comparing the determined maximum slot inlet temperature limit for the mating expansion card to a predefined default maximum allowable temperature limit that is not specific to the heat-producing component of the mating expansion card; and then either:

if the determined maximum slot inlet temperature limit for the mating expansion card is less than the predefined default maximum allowable temperature limit, then using the determined maximum slot inlet temperature limit as a temperature setpoint for closed loop control of the inlet temperature of the at least one expansion slot based on real time feedback of the temperature signal representing the real time sensed temperature at an inlet of the at least one expansion slot that is received from the at least one temperature sensor by controlling at least one of a real time speed of the at least one cooling fan or by power capping a real time power-consumption of at least one other heat-producing component within the chassis enclosure that is different from the heat-producing component of the mating expansion card; or if the determined maximum slot inlet temperature limit for the mating expansion card is greater than or equal to the predefined default maximum allowable temperature limit, then using the predefined default maximum allowable temperature limit as a temperature setpoint for closed loop control of the inlet temperature of the at least one expansion slot based on real time feedback of the temperature signal representing the real time sensed temperature at an inlet of the at least one expansion slot that is received from the at least one temperature sensor by controlling at least one of a real time speed of the at least one cooling fan or by power capping a real time power-consumption of at least one other heat-producing component within the chassis enclosure that is different from the heat-producing component of the mating expansion card.

19. The method of claim 11, where the at least one temperature sensor is a first temperature sensor; and where the method further comprises first determining if the mating expansion card either has no integrated second temperature sensor or has an integrated second temperature sensor that cannot be read by the at least one programmable integrated circuit; and then either:

if the mating expansion card is determined to either have no integrated second temperature sensor or to have an integrated second temperature sensor that cannot be read by the programmable integrated circuit, then using the at least one programmable integrated circuit to receive the sensed temperature from the first temperature sensor, determine the maximum slot inlet temperature limit for the mating expansion card, and use the determined maximum slot inlet temperature limit as the temperature setpoint for closed loop control of the inlet temperature of the at least one expansion slot; or if the mating expansion card is determined to an integrated second temperature sensor providing a second temperature signal that is readable by the at least one programmable integrated circuit, then receiving the second temperature signal from the second temperature sensor and providing closed loop control of the temperature of the heat-producing component of the expansion card based on real time feedback of the second temperature signal representative of the real time sensed second temperature of the heat-producing component of the expansion card by controlling at least one of a real time speed of the at least one cooling fan or by power capping a real time power-consumption of at least one other heat-producing component within the chassis enclosure that is different from the heat-producing component of the mating expansion card.

20. The method of claim 11, where the at least one expansion slot is a Peripheral Component Interconnect Express (PCIe) slot, and where the mating expansion card is a mating PCIe card that is configured to mate with the PCIe slot.

\* \* \* \* \*